(12) United States Patent
Sasaki

(10) Patent No.: US 10,622,548 B2
(45) Date of Patent: *Apr. 14, 2020

(54) MAGNETORESISTANCE EFFECT ELEMENT

(71) Applicant: TDK CORPORATION, Tokyo (JP)

(72) Inventor: Tomoyuki Sasaki, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/570,300

(22) Filed: Sep. 13, 2019

(65) Prior Publication Data

US 2020/0006640 A1 Jan. 2, 2020

Related U.S. Application Data

(63) Continuation of application No. 15/716,094, filed on Sep. 26, 2017, now Pat. No. 10,454,022.

(30) Foreign Application Priority Data

Sep. 29, 2016 (JP) .................... 2016-192009

(51) Int. Cl.
*H01L 43/02* (2006.01)
*H01L 43/10* (2006.01)
(Continued)

(52) U.S. Cl.
CPC ............ *H01L 43/02* (2013.01); *G11C 11/161* (2013.01); *H01L 43/08* (2013.01); *H01L 43/10* (2013.01); *H01L 27/222* (2013.01)

(58) Field of Classification Search
CPC .......... H01L 43/02; H01L 43/10; H01L 43/08
See application file for complete search history.

(56) References Cited

U.S. PATENT DOCUMENTS 5,998,644 A 12/1999 Kim et al.
2012/0061781 A1 3/2012 Ohmori et al.
(Continued)

FOREIGN PATENT DOCUMENTS

JP 2012-060087 A 3/2012
JP 2013-175615 A 9/2013
(Continued)

OTHER PUBLICATIONS

Hirokai Sukegawa et al., "Tunnel Magnetoresistance With Improved Bias Voltage Dependence in Lattice-Matched Fe/SPINEL MgAl2O4/Fe(001) Junctions" Applied Physics Letters, vol. 96, pp. 212505-1-212505-3 (2010).

(Continued)

*Primary Examiner* — Marc Anthony Armand
(74) *Attorney, Agent, or Firm* — Oliff PLC

(57) ABSTRACT

A magnetoresistance effect element has favorable symmetry of an MR ratio even if the sign of a bias voltage is different, which is capable of reversing magnetization to a current, which has a high MR ratio. A magnetoresistance effect element includes a laminate in which an underlayer, a first ferromagnetic metal layer, a tunnel barrier layer, and a second ferromagnetic metal layer are laminated in that order. The underlayer is made of one or more selected from a group containing of TiN, VN, NbN, and TaN, or mixed crystals thereof. The tunnel barrier layer is made of a compound having a spinel structure and represented by the following composition formula (1): $A_xGa_2O_y$, where A is a non-magnetic divalent cation and represents a cation of at least one element among magnesium, zinc, and cadmium, x is a number satisfying $0 < x \leq 2$, and y is a number satisfying $0 < y \leq 4$.

20 Claims, 6 Drawing Sheets

(51) Int. Cl.
*H01L 43/08* (2006.01)
*G11C 11/16* (2006.01)
*H01L 27/22* (2006.01)

(56) References Cited

U.S. PATENT DOCUMENTS

2012/0091548 A1 4/2012 Sukegawa et al.
2013/0003579 A1 1/2013 Lu et al.
2013/0221461 A1 8/2013 Sukegawa et al.
2017/0077394 A1* 3/2017 Saida ............... H01L 43/10

FOREIGN PATENT DOCUMENTS

JP 5586028 B2 9/2014
JP 5588019 B2 9/2014

OTHER PUBLICATIONS

Thomas Scheike et al., "Lattice-Matched Magnetic Tunnel Junctions Using a Heusler Alloy Co2FeAl and a Cation-Disorder SPINEL Mg—Al—O Barrier" Applied Physics Letter, vol. 105, pp. 242407-1-242407-5 (2014).
Yoshiro Miura et al., "First-Principles Study of Tunneling Magnetoresistance in Fe/MgAl2O4/Fe(001) Magnetic Tunnel Junctions" Physical Review B, vol. 86, pp. 024426-1-024426-6 (2012).
Hiroaki Sukegawa et al., "Enhanced Tunnel Magnetoresistance in a SPINEL Oxide Barrier With Cation-Site Disorder" Physical Review B, vol. 86, pp. 184401-1-184401-5 (2012).
Mar. 20, 2019 Office Action issued in U.S. Appl. No. 15/716,094.
Anisotropic Magnetoresistance Effect in C02(Fe—Mn)(Al—Si) Heusler Alloy Thin Film (IEEE Transactions on Magnetics, vol. 51 ,No. 11, Nov. 2015 (Year: 2015).

* cited by examiner

MAGNETORESISTANCE EFFECT ELEMENT

This is a Continuation of application Ser. No. 15/716,094 filed Sep. 26, 2017, which in turn claims the benefit of Japanese Patent Application No. 2016-192009, filed Sep. 29, 2016. The disclosure of the prior applications is hereby incorporated by reference herein in its entirety.

BACKGROUND OF THE INVENTION

Field of the Invention

The present invention relates to a magnetoresistance effect element.

Description of Related Art

A giant magnetoresistance (GMR) element made of a multilayer film including a ferromagnetic layer and a non-magnetic layer and a tunnel magnetoresistance (TMR) element in which an insulating layer (a tunnel barrier layer and a barrier layer) is used as a non-magnetic layer are known (JP2012-60087A; JP5586028B, JP2013-175615A; APPLIED PHYSICS LETTERS 96, 212505, (2010); Applied Physics Letters, 105, 242407 (2014); and Physical Review B 86, 024426 (2012)). In general, the TMR element has a higher element resistance than the GMR element, and the TMR element has a higher magnetoresistance (MR) ratio than the GMR element. TMR elements can be classified into two types. The first type is a TMR element that uses only a tunneling effect which utilizes a leaching effect of a wave function between ferromagnetic layers. The second type is a TMR element that uses a coherent tunnel which utilizes conduction of a specific orbital of a non-magnetic insulating layer to be tunneled when the above tunneling effect is exhibited. It is known that the TMR element using the coherent tunnel can obtain a higher MR ratio than the TMR element using only the tunneling effect. This coherent tunneling effect is exhibited when both of the ferromagnetic layer and the non-magnetic insulating layer are crystalline, and an interface between the ferromagnetic layer and the non-magnetic insulating layer is crystallographically continuous.

Magnetoresistance effect elements are used for various applications. For example, as a magnetic sensor, a magnetoresistance effect type magnetic sensor is known. In a hard disk drive, a magnetoresistance effect element determines a characteristic of a playback function.

The magnetoresistance effect type magnetic sensor is a magnetic sensor configured to detect an effect of a change in a magnetization direction of a magnetoresistance effect element due to a magnetic field from the outside as a change in resistance of a magnetoresistance effect element.

A device expected in the future is a magnetoresistance change type random access memory (MRAM). The MRAM is a memory in which directions of ferromagnetic magnetism of two layers are appropriately changed to parallel or antiparallel and which reads a magnetoresistance as a digital signal such as 0 or 1.

SUMMARY OF THE INVENTION

Writing of information using spin transfer torque (STT) is drawing attention in the MRAM. This is because a current density at which information can be written is applied to a magnetic element; and information to be written can be determined according to a direction of a current. However, a current or a voltage necessary for rewriting information varies since the information is generally rewritten by the direction of the current applied to the magnetoresistance effect element, which is the polarity of the voltage. Thus, there is a problem that ease of rewriting varies depending on information.

One factor of the problem that ease of rewriting varies depending on information is that the MR ratio varies depending on the direction of the current that flows in the magnetoresistance effect element. Using the STT, ease of rewriting is proportional to the magnitude of the MR ratio. That is, when the MR ratio varies depending on the direction of the current, the magnitude of the current for rewriting information varies. Therefore, an element in which the MR ratio does not depend on the direction of the current bias (the symmetry of the MR ratio with respect to a current bias is favorable), that is, a magnetoresistance effect element, is required as an MRAM or a switch. In addition, when the magnetoresistance effect element is used as a high frequency oscillator or a wave detector, similarly, a magnetoresistance effect element in which the MR ratio does not depend on the direction of the current bias is required. In high frequency applications, if the symmetry with respect to the current bias is excellent, stability with respect to a frequency is improved.

As a material of a tunnel barrier layer capable of obtaining the coherent tunneling effect, MgO is widely known. In JP2012-60087A, JP5586028B and APPLIED PHYSICS LETTERS 96, 212505, (2010), as a material of the tunnel barrier layer, an oxide having a spinel structure is described. In JP2012-60087A, as examples of the oxide having a spinel structure, $MgAl_2O_4$, $FeAl_2O_4$, $CoAl_2O_4$, $MgCr_2O_4$, and $MgGa_2O_4$ are named. In addition, it is described in JP2013-175615A, Applied Physics Letters, 105, 242407 (2014), and Physical Review B 86, 024426 (2012) that $MgAl_2O_4$ needs to have a disordered spinel structure in order to obtain a high MR ratio. The disordered spinel structure referred to here is a structure in which O atoms are arranged to form a closely packed cubic lattice which is substantially the same as that of a spinel, but an atomic arrangement of Mg and Al is disordered, and is cubic as a whole. In the original spinel, Mg and Al are regularly arranged in tetrahedral voids and octahedral voids of oxygen ions. However, in the disordered spinel structure, since these are provided at random, the symmetry of crystals is changed, and a structure has a lattice constant which is substantially reduced from about 0.808 nm of $MgAl_2O_4$ by half is provided.

The purpose of the present invention is to provide a magnetoresistance effect element which has more favorable symmetry of an MR ratio with respect to the polarity of a bias voltage than the conventional TMR element in which MgO and $MgAl_2O_4$ are used as a material of the tunnel barrier layer. In the magnetoresistance effect element, when a bias voltage is positive and negative, the proportion of a change in the MR ratio according to the change in an applied voltage value is the same. Moreover, magnetization reversal by the current can be performed efficiently; and a high MR ratio of the magnetoresistance effect element can be obtained.

In order to address the above problem, a magnetoresistance effect element according to the present invention has a laminate in which: an underlayer; a first ferromagnetic metal layer; a tunnel barrier layer, and a second ferromagnetic metal layer are laminated in this order, wherein the underlayer is made of one or more selected from a group consisting of TiN, VN, Nb, and TaN or mixed crystal thereof, and the tunnel barrier layer is made of a compound having a spinel structure and represented by a composition formula (1) below.

$$A_xGa_2O_y \qquad (1):$$

where A is a non-magnetic divalent cation and represents a cation of at least one element selected from a group consisting of magnesium, zinc, and cadmium, x is a number that satisfies $0<x\leq 2$, and y is a number that satisfies $0<y\leq 4$.

Since a spinel material containing gallium and oxygen shows a symmetric MR ratio irrespective of the sign of a bias voltage, the spin polarizability hardly attenuates in a low bias region. Therefore, information can be rewritten with a lower voltage than that in the related art.

Further, it is believed that the MR ratio further increases because the underlayer is made of one or more selected from the group consisting of TiN, VN, NbN, and TaN or, mixed crystals thereof. Although the reason for this is not clear, the inventors found that, when a difference between a crystal lattice constant of a material constituting the tunnel barrier layer and a number obtained by multiplying a crystal lattice constant that a nitride constituting the underlayer has by n (n is a natural number or 1/natural number) is smaller, the MR ratio is larger. Therefore, influence of the under layer on the crystallinity of the tunnel barrier layer should be taken into account. This result contradicts with the conventional wisdom. Generally, it is said that a nitride film formed by a reactive sputtering method is amorphous. Therefore, a TiN film, a VN film, an NbN film, and a TaN film formed by the reactive sputtering method used in examples are amorphous. However, when the underlayer is completely amorphous, there is no crystallographic correlation with a layer thereabove, and the result obtained by the inventors contradicts with the conventional wisdom.

The reason for this is inferred to be as follows. Since no atomic image is obtained even if the underlayer of the present invention is observed through TEM, it cannot be said that the underlayer is completely crystallized. On the other hand, the underlayer cannot be said to be completely amorphous, and although there is not an extent to obtain an atomic image through TEM, it is believed that an image that locally includes a crystalline part may be close to reality.

The present invention reveals new prospects for increasing the MR ratio of the magnetoresistance effect element with respect to a current state in which the nitride film formed by the reactive sputtering method is amorphous.

Here, as will be described below in examples, the result can be described by comparing a lattice mismatching degree obtained from a crystal lattice constant that a nitride (TiN, VN, NbN, TaN, and a mixed crystal thereof) constituting an underlayer of a magnetoresistance effect element has and a lattice constant of a tunnel barrier layer with the MR ratio. The crystal structure that VN, TiN, and a mixed crystal thereof can have is generally a tetragonal structure (NaCl structure) and is a crystal structure in which a space group is Fm-3m. A crystal lattice constant of the structure is disclosed in, for example, "AtomWork" (accessed on Aug. 23, 2016, URL: http://crystdb.nims.go.jp/) provided by National Institute for Materials Science (Japan).

Furthermore, since TiN, VN, NbN, and TaN have conductivity, when an underlayer is made of such a nitride, a voltage can be applied to the magnetoresistance effect element through the underlayer, and the configuration of the element can be simplified.

In the magnetoresistance effect element, A in the composition formula (1) may be a cation of at least one element selected from a group consisting of magnesium and zinc, and the underlayer is made of one or more selected from a group consisting of TiN, VN, and TaN, or mixed crystals thereof.

When the material constituting the underlayer and the material constituting the tunnel barrier layer are combined as above, a difference of lattice constants between the underlayer and the tunnel barrier layer is further reduced and the MR ratio further increases.

In the magnetoresistance effect element, A in the composition formula (1) may be a cadmium ion, and the underlayer may be made of NbN.

When the material constituting the underlayer and the material constituting the tunnel barrier layer are combined as above, a difference of lattice constants between the underlayer and the tunnel barrier layer is further reduced and the MR ratio further increases.

In the magnetoresistance effect element, the tunnel barrier layer may include: a lattice-matched portion that lattice-matches with both of the first ferromagnetic metal layer and the second ferromagnetic metal layer; and a non-lattice-matched portion that is free of a lattice-matching with at least one of the first ferromagnetic metal layer and the second ferromagnetic metal layer.

In the magnetoresistance effect element, the tunnel barrier layer may have a spinel structure in which an atomic arrangement is disordered.

When the spinel structure in which an atomic arrangement is disordered is provided, the coherent tunneling effect is strengthened due to an electronic band folding effect, and the MR ratio increases.

In the magnetoresistance effect element, a crystal lattice of either or both of the first ferromagnetic metal layer and the second ferromagnetic metal layer may match the tunnel barrier layer in a cubic-on-cubic structure.

A spinel material containing gallium and oxygen has a cubic-on-cubic structure in which a ferromagnetic material such as iron matches a crystal lattice. Therefore, since scattering at an interface between the tunnel barrier layer and the ferromagnetic metal layer is prevented, a bias dependency of the MR ratio shows a symmetric structure irrespective of a direction of a voltage. Therefore, information can be rewritten with a lower voltage than that in the related art.

In the magnetoresistance effect element, coercivity of the second ferromagnetic metal layer may be greater than coercivity of the first ferromagnetic metal layer.

Since coercivity of the first ferromagnetic metal layer and the second ferromagnetic metal layer are different from each other, the element functions as a spin valve and can be applied for devices.

In the magnetoresistance effect element, a magnetoresistive ratio may be 100% or more under an application of a voltage of 1 V or more at room temperature.

In a device to which a high bias voltage is applied such as a high sensitivity magnetic sensor, a logic-in-memory, and an MRAM, the magnetoresistance effect element can be used.

In the magnetoresistance effect element, at least one of the first ferromagnetic metal layer and the second ferromagnetic metal layer may have magnetic anisotropy perpendicular to a lamination direction.

Since it is not necessary to apply a bias magnetic field, it is possible to reduce the size of the device. In addition, since the element has a high thermal disturbance resistance, it can function as a recording element.

In the magnetoresistance effect element, at least one of the first ferromagnetic metal layer and the second ferromagnetic metal layer may be $Co_2Mn_{1-a}Fe_aAl_bSi_{1-b}$ (0≤a≤1, 0≤b≤1).

$Co_2Mn_{1-a}Fe_aAl_bSi_{1-b}$ is a ferromagnetic metal material having a high spin polarizability, and it is possible to obtain a higher MR ratio compared to when another ferromagnetic metal material is used.

According to the present invention, it is possible to provide a magnetoresistance effect element which has more favorable symmetry of an MR ratio with respect to the polarity of a bias voltage than a TMR element in which MgO and $MgAl_2O_4$ are used as a material of a tunnel barrier layer of the related art, that is, when a bias voltage is positive and negative, the proportion of a change in the MR ratio according to a change in an applied voltage value is the same, and which is capable of efficiently reversing magnetization according to a current, and has a high MR ratio.

DETAILED DESCRIPTION OF THE INVENTION

Figure 1:
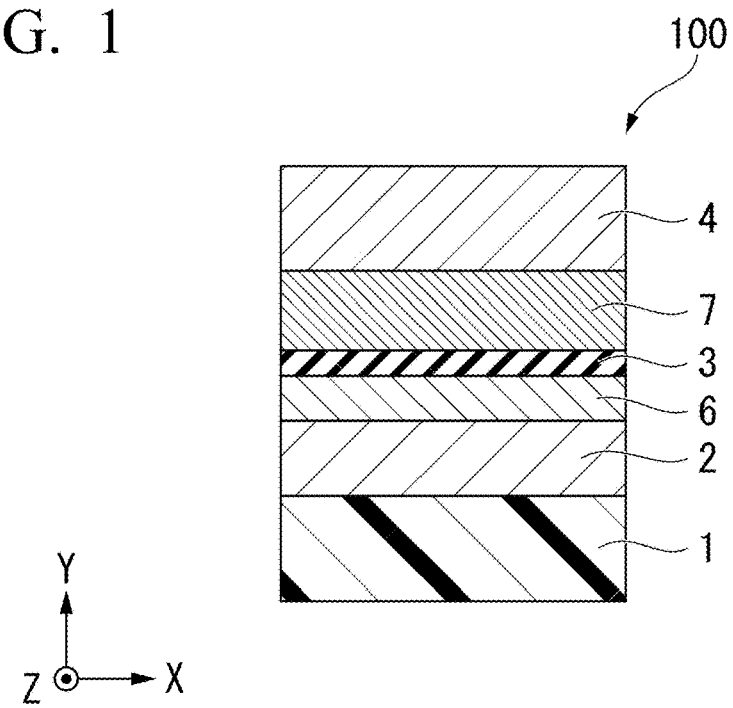
FIG. 1 is an enlarged cross-sectional view of a main part for explaining a laminated structure of a magnetoresistance effect element according to an aspect of the present invention.

Embodiments of the present invention will be described below in detail with reference to the drawings. Here, in descriptions of the drawings, the same components are denoted with the same reference numerals and redundant descriptions will be omitted.

First Embodiment

A magnetoresistance effect element 100 according to a first embodiment will be described below. The magnetoresistance effect element 100 has a laminate in which an underlayer 2, a first ferromagnetic metal layer 6, a tunnel barrier layer 3, and a second ferromagnetic metal layer 7 are laminated in that order. The underlayer 2 is made of TiN, VN, or a mixed crystal thereof. The tunnel barrier layer 3 is made of a compound having a spinel structure and represented by the following composition formula (1).

$A_xGa_2O_y$           (1):

where, A is a non-magnetic divalent cation and represents a cation of at least one element selected from the group consisting of magnesium, zinc, and cadmium, x is a number that satisfies 0<x≤2, and y is a number that satisfies 0<y≤4

(Basic Structure)

In the example shown in FIG. 1, the magnetoresistance effect element 100 is provided on a substrate 1 and has a structure in which the underlayer 2, the first ferromagnetic metal layer 6, the tunnel barrier layer 3, the second ferromagnetic metal layer 7, and a cap layer 4 are laminated in that order from the substrate 1.

(Underlayer)

The underlayer 2 is made of one or more selected from the group consisting of TiN, VN, NbN, and TaN or, mixed crystals thereof. Here, the term "mixed crystals" is used for convenience of description, and it does not mean that the underlayer 2 is crystalline, but simply means that a film is formed of a combination of two or more nitrides, and may refer to a mixed film containing two or more nitrides. As examples of the mixed crystals, a material containing TiN and VN, a material containing TiN and TaN, TiN, and NbN can be exemplified. In addition, it is not necessary for the metal nitride constituting the underlayer 2 to have an atomic ratio between a metal element and N of 1:1. The atomic ratio between a metal element and N is preferably in a range of 1:0.5 to 1:2 (=metal element: N).

(Tunnel Barrier Layer)

The tunnel barrier layer 3 is made of a non-magnetic insulating material. In general, a film thickness of the tunnel barrier layer is 3 nm or less. When the tunnel barrier layer 3 is interposed between metal materials, since a wave function of electrons included in atoms of the metal materials spread beyond the tunnel barrier layer 3, a current can flow although an insulator is provided on a circuit. The magnetoresistance effect element 100 has a structure in which the tunnel barrier layer 3 is interposed between ferromagnetic metal materials, and a resistance value is determined by a relative angle formed by magnetization directions of sandwiching ferromagnetic metals. In the magnetoresistance effect element 100, a general tunneling effect and the coherent tunneling effect in which orbitals during tunneling are limited are exhibited. In the general tunneling effect, a magnetoresistance effect is obtained due to the spin polarizability of a ferromagnetic material. On the other hand, in coherent tunneling, since orbitals during tunneling are limited, a greater effect than with the spin polarizability of a ferromagnetic material can be expected. Therefore, in order for the coherent tunneling effect to be exhibited, the ferromagnetic material and the tunnel barrier layer 3 need to be crystallized and bonded in a specific direction.

(Spinel Structure)

The non-magnetic insulating material constituting the tunnel barrier layer 3 is a compound having a spinel structure and represented by the composition formula (1). Here, in the present embodiment, the spinel structure includes a regular spinel structure and a spinel structure (regular spinel structure) in which an atomic arrangement is disordered.

Figure 2:
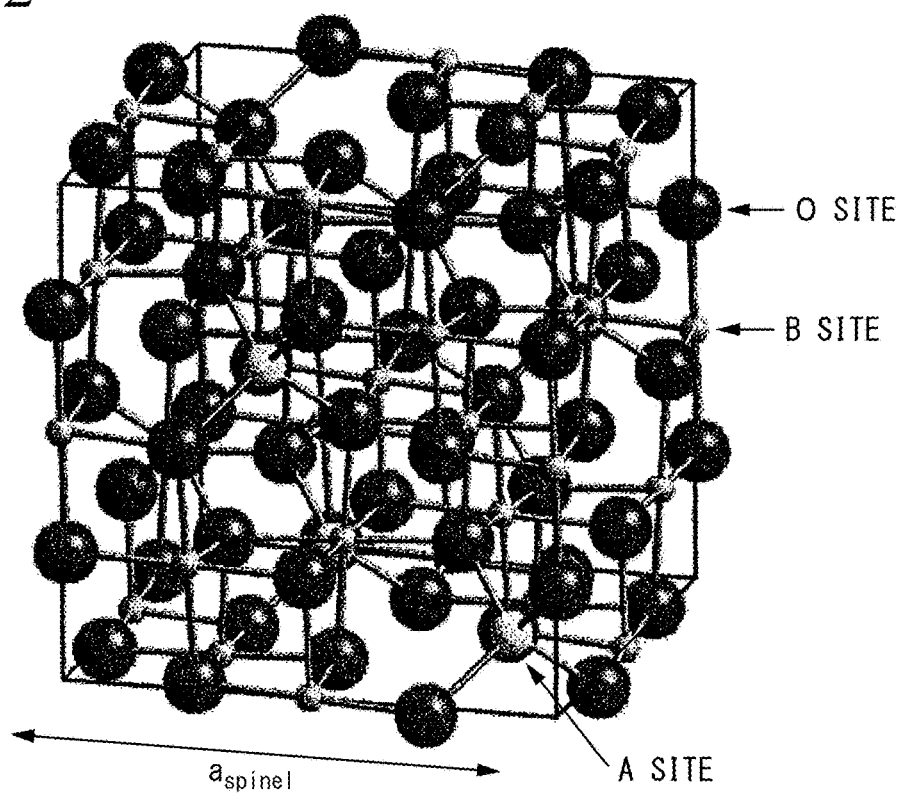
FIG. 2 is a schematic diagram of an example of a crystal structure of a regular spinel constituting a tunnel barrier layer of a magnetoresistance effect element according to an aspect of the present invention.
Figure 3:
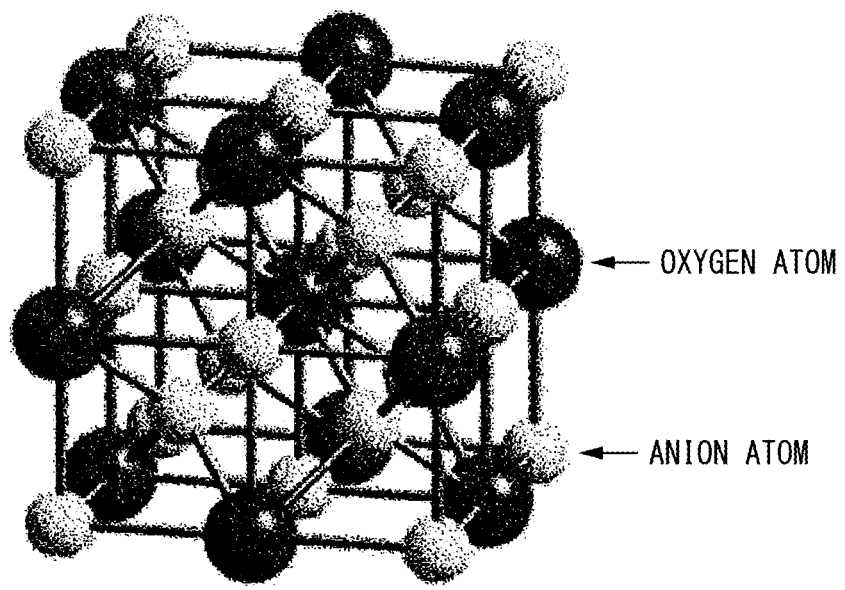
FIG. 3 is a schematic diagram of an example of a crystal structure of a disordered spinel constituting a tunnel barrier layer of a magnetoresistance effect element according to an aspect of the present invention.
Figure 4:
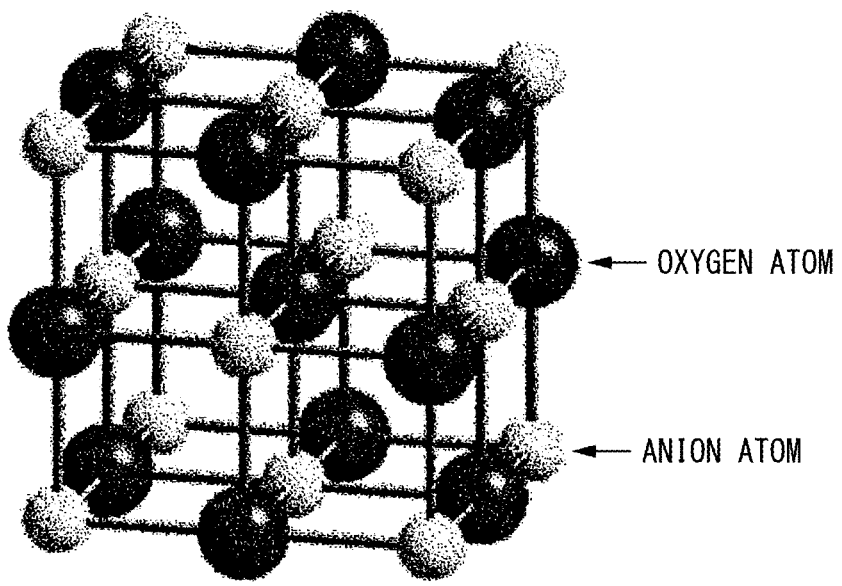
FIG. 4 is a schematic diagram of another example of a crystal structure of a disordered spinel constituting a tunnel barrier layer of a magnetoresistance effect element according to an aspect of the present invention.
Figure 5:
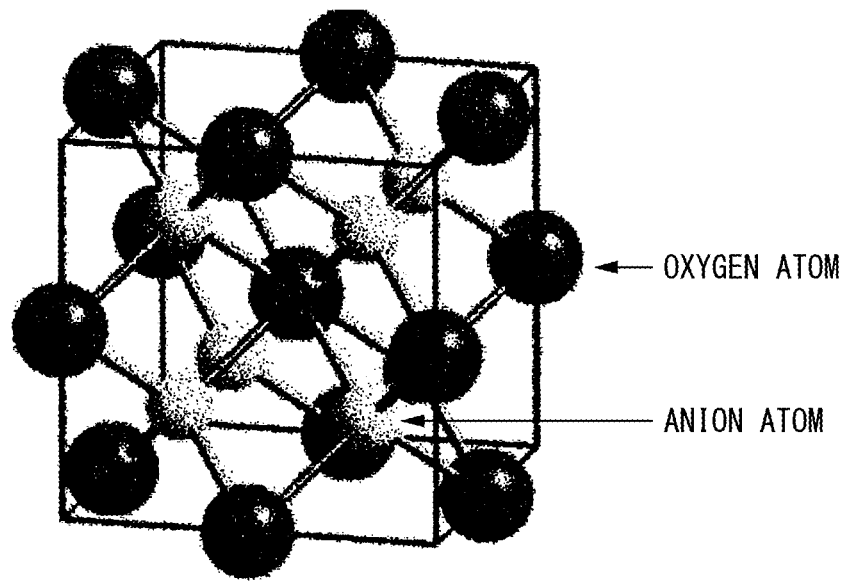
FIG. 5 is a schematic diagram of still another example of a crystal structure of a disordered spinel constituting a tunnel barrier layer of a magnetoresistance effect element according to an aspect of the present invention.
Figure 6:
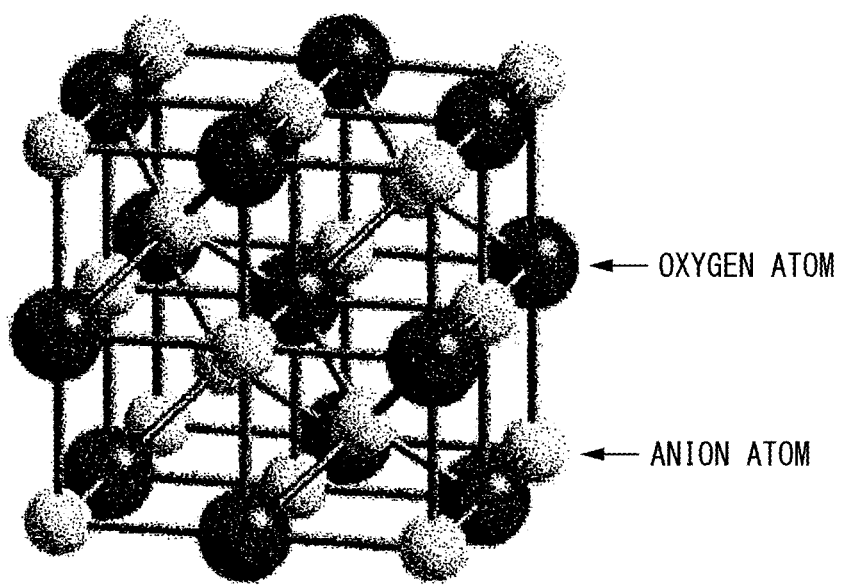
FIG. 6 is a schematic diagram of yet another example of a crystal structure of a disordered spinel constituting a tunnel barrier layer of a magnetoresistance effect element according to an aspect of the present invention.
Figure 7:
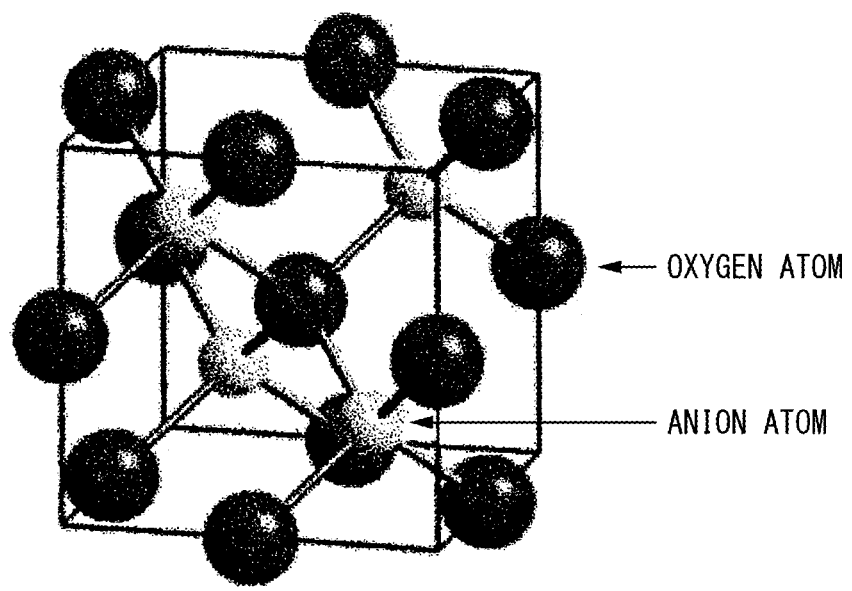
FIG. 7 is a schematic diagram of yet another example of a crystal structure of a disordered spinel constituting a tunnel barrier layer of a magnetoresistance effect element according to an aspect of the present invention.

As shown in FIG. 2, the regular spinel structure refers to a structure which includes an A site in which cations tetra-coordinate with oxygen atoms and a B site in which cations hexa-coordinate with oxygen atoms. In the structure, oxygen atoms are arranged to form a closely packed cubic lattice, and the structure is cubic as a whole. The disordered spinel structure refers to a structure in which oxygen atoms are arranged to form a closely packed cubic lattice which is substantially the same as that in the regular spinel structure, but an atomic arrangement of cations is disordered. That is, in the regular spinel structure, cations are regularly arranged in tetrahedral voids and octahedral voids of oxygen atoms. On the other hand, in the disordered spinel structure, since cations are provided at random, the symmetry of crystals is changed, and a lattice constant is substantially reduced by half in the structure. For example, it is known that a space group consisting of the regular spinel structure represented by $MgAl_2O_4$ is Fd-3m, but a space group consisting of the disordered spinel structure in which a lattice constant is reduced by half is Fm-3m or F-43m. As the disordered spinel structure, there are five possible structures in total shown in FIG. 3 to FIG. 7, and any one of these structures or a structure in which these structures are mixed may be used. The disordered spinel structure is called a Sukenel structure in some cases.

In addition, in the disordered spinel structure, when a unit of lattice repetition is changed, a combination of a ferromagnetic layer material and an electron structure (band structure) is changed. Therefore, the disordered spinel structure shows greater TMR enhancement due to the coherent tunneling effect than the regular spinel structure. Thus, when the tunnel barrier layer 3 has a disordered spinel structure, the coherent tunneling effect is strengthened due to an electronic band folding effect and the MR ratio increases.

Here, in the present embodiment, it is not essentially needed for the disordered spinel structure to be cubic as a whole. A crystal structure of the non-magnetic insulating material constituting the tunnel barrier layer 3 is influenced by the crystal structure of the underlying material, and the lattice is partially distorted. Although such materials have a bulk crystal structure, when a thin film is formed, a partially distorted crystal structure based on a bulk crystal structure is taken.

In particular, in the present embodiment, the tunnel barrier layer 3 is a very thin film, and is easily influenced by the crystal structure of the layer in contact with the tunnel barrier layer 3. However, in the material having the disordered spinel structure, the bulk crystal structure is basically cubic. The disordered spinel structure in the present embodiment includes a structure slightly deviated from cubic even if it is not cubic. In general, the deviation from the cubic in the disordered spinel structure in the present embodiment is slight, and depends on accuracy of the measurement method of evaluating the crystal structure.

A divalent cation in non-magnetic elements contained in the tunnel barrier layer 3, that is, A in the composition formula (1), forms an A site of the spinel structure. The divalent cation that forms the A site is a cation of at least one non-magnetic element selected from the group consisting of magnesium, zinc, and cadmium. Magnesium, zinc, and cadmium are stable in a divalent state, and when they used as constituent elements of the tunnel barrier layer, coherent tunneling can be realized and the MR ratio increases.

When divalent cations contained in the tunnel barrier layer 3 are derived from a plurality of types of non-magnetic element, such divalent cations of a plurality of types of non-magnetic element preferably have a small ionic radius difference that is 0.2 Å or less. When the ionic radius difference is small, a cation arrangement does not easily become ordered, and a disordered spinel structure having a smaller lattice constant than a general regular spinel structure is obtained. Therefore, when the tunnel barrier layer includes two or more types of non-magnetic element having a small ionic radius difference, the MR ratio further increases.

Oxygen atoms contained in the tunnel barrier layer 3 form the A site tetra-coordinating with divalent cations, and form the B site hexa-coordinating with trivalent cations. Oxygen atoms may be vacant. Thus, in composition formula (1), y is a number that satisfies 0<y≤4. However, the tunnel barrier layer 3 may have a portion in which y in composition formula (1) exceeds 4.

Among non-magnetic elements contained in the tunnel barrier layer 3, gallium forms a B site of the spinel structure. When the B site includes gallium and oxygen, since the symmetric MR ratio is exhibited regardless of the sign of the bias voltage, the spin polarizability hardly attenuates in a low bias region.

(Relationship Between Underlayer and Tunnel Barrier Layer)

A lattice constant difference between the underlayer 2 and the tunnel barrier layer 3 is preferably small. That is, a difference between a lattice constant of the crystal structure that the underlayer 2 can have and a lattice constant of the tunnel barrier layer 3 is preferably small. Specifically, selection is performed such that a lattice mismatching degree defined in the following formula is within 5%, and preferably within 3%.

lattice mismatching degree (%)=absolute value of $(C-nD)/nD \times 100$

Here, C is a lattice constant of the tunnel barrier layer 3, and D is a lattice constant of a crystal structure that the underlayer 2 can have. n is a natural number or 1/natural number, and is generally 1, ½, or 2.

Here, the "crystal structure that the underlayer 2 can take" means a crystal structure a bulk of TiN, VN, NbN, and TaN or a mixed crystal thereof constituting the underlayer 2 and a crystal structure expected to be (inherently) taken in the underlayer 2. As described above, it is conceivable that the underlayer 2 is in an intermediate condition between a perfect crystalline state and an amorphous state. Therefore, what structure the crystal structure of the underlayer 2 may have cannot be clearly defined. On the other hand, it is not believed that the crystal structure of the actual underlayer 2 is significantly different from the crystal structure that can be taken when the underlayer 2 is constituted by a bulk material. As the crystal structure that the underlayer 2 can assume, there is a tetragonal crystal structure.

When a difference of lattice constants between the underlayer 2 and the tunnel barrier layer 3 is small, the MR ratio of the magnetoresistance effect element 100 increases. As described above, the underlayer 2 formed by a reactive sputtering method is thought to be amorphous. Therefore, the matching between the crystal structure of the tunnel barrier layer 3 and the crystal structure that the underlayer 2 can have an influence on an increase in the MR ratio of the magnetoresistance effect element 100, which is a novel finding.

For example, when the tunnel barrier layer 3 is made of a non-magnetic insulating material in which A in composition formula (1) is a cation of at least one element selected from the group consisting of magnesium and zinc, the underlayer 2 is preferably made of one or more selected from the group consisting of TiN, VN, and TaN, or mixed crystals thereof. In addition, when the tunnel barrier layer 3 is made of a non-magnetic insulating material in which A in composition formula (1) is a cadmium ion, the underlayer 2 is preferably made of NbN.

(First Ferromagnetic Metal Layer)

As a material of the first ferromagnetic metal layer 6, a ferromagnetic material, and particularly a soft magnetic material is applied. For example, a metal selected from the group consisting of Cr, Mn, Co, Fe, and Ni, an alloy containing at least one metal of the above group, and an alloy containing one or a plurality of metals selected from the group and at least one element among B, C, and N may be exemplified. Specifically, Co—Fe, Co—Fe—B, and Ni—Fe can be exemplified.

When a magnetization direction of the first ferromagnetic metal layer 6 is perpendicular to the lamination surface, the film thickness of the first ferromagnetic metal layer 6 is preferably 2.5 nm or less. At the interface between the first ferromagnetic metal layer 6 and the tunnel barrier layer 3, perpendicular magnetic anisotropy can be applied to the first ferromagnetic metal layer 6. In addition, since the effect of perpendicular magnetic anisotropy is weakened when the film thickness of the first ferromagnetic metal layer 6 increases, the film thickness of the first ferromagnetic metal layer 6 is preferably small.

(Second Ferromagnetic Metal Layer)

As a material of the second ferromagnetic metal layer 7, for example, a metal selected from the group consisting of Cr, Mn, Co, Fe, and Ni, an alloy containing at least one metal of the above group, and an alloy containing one or a plurality of metals selected from the group and at least one element among B, C, and N may be exemplified. Specifically, Co—Fe and Co—Fe—B can be exemplified. Further, in order to obtain a high output, the Heusler alloy such as $Co_2FeSi$ is preferable. The Heusler alloy includes an intermetallic compound having the chemical composition of $X_2YZ$. X is a transition metal element of the group Co, Fe, Ni, or Cu in the periodic table or a noble metal element. Y is a transition metal of the group Mn, V, Cr, or Ti, and can also be an element of type X Z is a typical element of group III to group V. For example, $Co_2FeSi$, $Co_2MnSi$, and $Co_2Mn_{1-a}Fe_aAl_bSi_{1-b}$ may be exemplified. In addition, as a material in contact with the second ferromagnetic metal layer 7, an antiferromagnetic material such as IrMn or PtMn may be used in order for coercivity to be greater than that of the first ferromagnetic metal layer 6. Further, in order to prevent a leakage magnetic field of the second ferromagnetic metal layer 7 from influencing the first ferromagnetic metal layer 6, a synthetic ferromagnetic coupling structure may be used.

When a magnetization direction of the second ferromagnetic metal layer 7 is perpendicular to the lamination surface, a laminate film of Co and Pt is preferably used. When the second ferromagnetic metal layer 7 is formed of, for example, FeB (1.0 nm)/Ta (0.2 nm)/[Pt (0.16 nm)/Co (0.16 nm)]$_4$/Ru (0.9 nm)/[Co (0.24 nm)/Pt (0.16 nm)]$_6$, the magnetization direction can be set to perpendicular thereto.

In general, the first ferromagnetic metal layer 6 is called a free layer because the magnetization direction can be more easily changed due to an external magnetic field or spin torque than in the second ferromagnetic metal layer 7. In addition, the second ferromagnetic metal layer 7 has a structure in which the magnetization direction is fixed, and the second ferromagnetic metal layer 7 is called a fixed layer.

(Substrate)

The magnetoresistance effect element according to the present invention may be formed on a substrate.

In this case, a material excellent in flatness is preferably used for the substrate 1. The substrate 1 varies depending on desired products. For example, in the case of an MRAM, a circuit formed on an Si substrate can be used under a magnetoresistance effect element. Alternatively, in the case of magnetic head, an AlTiC substrate that is easily processed can be used.

(Cap Layer)

In the magnetoresistance effect element according to the present invention, a cap layer may be formed on the surface (in FIG. 1, an upper surface of the second ferromagnetic metal layer 7) opposite to the side of the tunnel barrier layer 3 of the second ferromagnetic metal layer 7.

The cap layer 4 is provided on the second ferromagnetic metal layer 7 in the lamination direction and is used for controlling crystallinity such as a crystal direction and a grain size of the second ferromagnetic metal layer 7 and diffusion of elements. When the crystal structure of the second ferromagnetic metal layer 7 is the bcc structure, the crystal structure of the cap layer 4 may be any one of the fcc structure, the hcp structure, and the bcc structure. When the crystal structure of the second ferromagnetic metal layer 7 is the fcc structure, the crystal structure of the cap layer 4 may be any one of the fcc structure, the hcp structure, and the bcc structure. The film thickness of the cap layer 4 may be in a range in which a strain relaxation effect is obtained and furthermore a reduction in the MR ratio due to a shunt is not observed. The film thickness of the cap layer 4 is preferably 1 nm or more and 30 nm or less.

(Shapes and Sizes of Elements)

The laminate including the first ferromagnetic metal layer 6, the tunnel barrier layer 3, and the second ferromagnetic metal layer 7 constituting the present invention has a columnar shape. The laminate in a plan view can have various shapes such as a circle, a rectangle, a triangle, and a polygon, and is preferably circular in consideration of the symmetry. That is, the laminate preferably has a cylindrical shape.

When the laminate has a cylindrical shape, the diameter of the circle in a plan view is preferably 80 nm or less, more preferably 60 nm or less, and most preferably 30 nm or less.

When the diameter is 80 nm or less, it is difficult for the ferromagnetic metal layer to have a domain structure, and it is not necessary to take into account a component having spin polarization different from that of the ferromagnetic metal layer. Further, when the diameter is 30 nm or less, the ferromagnetic metal layer has a single domain structure, and a magnetization reversal rate and a probability increase. In addition, in a miniaturized magnetoresistance effect element, in particular, there is a strong demand for reducing the resistance.

(Configuration at the Time of Use)

Figure 8:
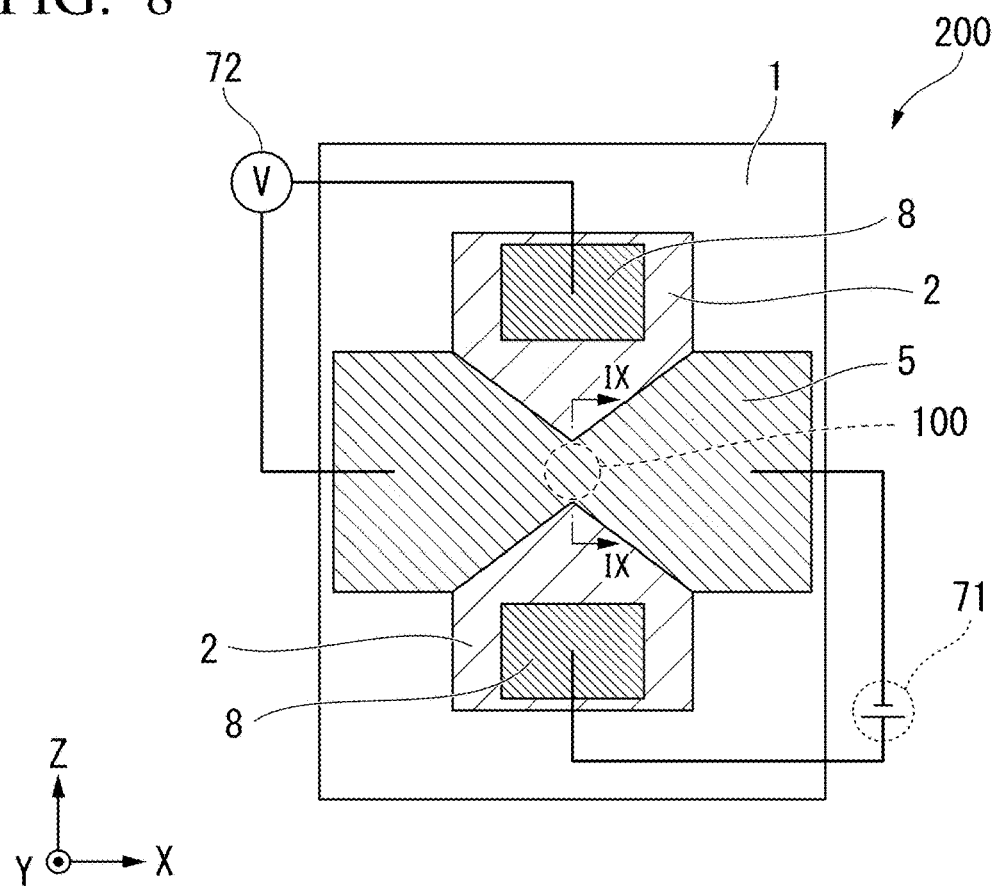
FIG. 8 is a plan view of a magnetoresistance effect device including a magnetoresistance effect element according to an aspect of the present invention.
Figure 9:
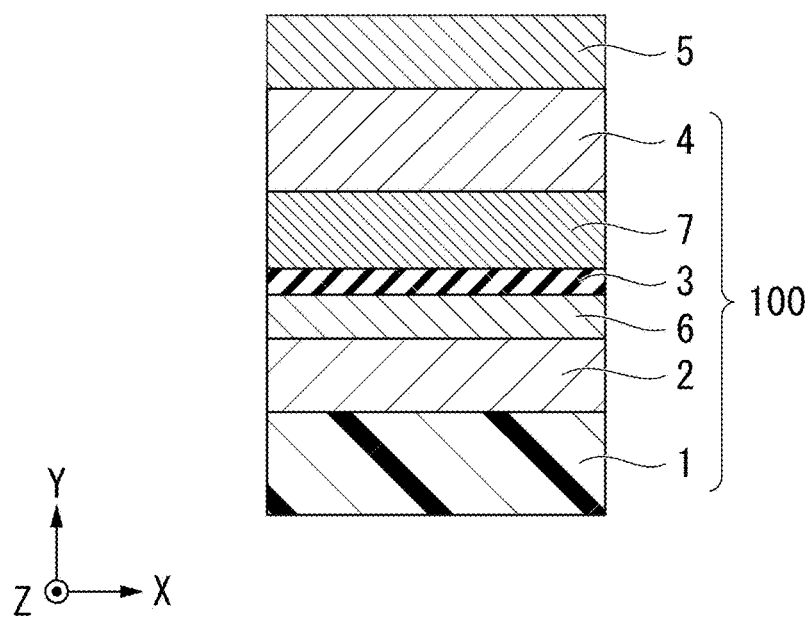
FIG. 9 is a cross-sectional view taken along the line IX-IX in FIG. 8.

FIG. 8 and FIG. 9 show examples of a magnetoresistance effect device including the magnetoresistance effect element of the present embodiment.

FIG. 8 is a plan view of a magnetoresistance effect device 200 (a diagram in which the magnetoresistance effect device 200 is viewed from the above in a lamination direction). FIG. 9 is a cross-sectional view taken along the line IX-IX in FIG. 8. In the magnetoresistance effect device 200 shown in FIG. 8 and FIG. 9, an electrode layer 5 that extends in the x direction is formed on the cap layer 4 of the magnetoresistance effect element 100. The underlayer 2 extends in the z direction past an end of the first ferromagnetic metal layer 6, and an electrode pad 8 is formed above the extended portion. Between the electrode layer 5 and the electrode pad 8, a current source 71 and a voltmeter 72 are provided. When voltage is applied to the underlayer 2 and the electrode layer 5 by the current source 71, the current flows in the lamination direction of the laminate including the first ferromagnetic metal layer 6, the tunnel barrier layer 3, and the second ferromagnetic metal layer 7. The applied voltage at this time is monitored by the voltmeter 72.

(Evaluation Method)

An exemplary method of evaluating the magnetoresistance effect element 100 will be described with reference to FIG. 8 and FIG. 9. For example, as shown in FIG. 8, the current source 71 and the voltmeter 72 are provided, constant current or constant voltage is applied to the magnetoresistance effect element 100, and the voltage or the current is measured while sweeping a magnetic field from the outside. Thus, a change in the resistance of the magnetoresistance effect element 100 can be observed.

The MR ratio is generally represented by the following formula.

MR ratio (%)={($R_{AP}$-$R_P$)/$R_P$}×100

$R_P$ is a resistance when magnetization directions of the first ferromagnetic metal layer 6 and the second ferromagnetic metal layer 7 are parallel. RAP is a resistance when magnetization directions of the first ferromagnetic metal layer 6 and the second ferromagnetic metal layer 7 are antiparallel.

$V_{half}$ is obtained by measuring the MR ratio when a low bias voltage of, for example, 1 mV is applied, and specifying a voltage at which the MR ratio is reduced by half while increasing the bias voltage. Here, when electrons move from the second ferromagnetic metal layer 7 to the first ferromagnetic metal layer 6, $V_{half}$ is defined as a positive direction, and otherwise, defined as a negative direction. That is, when a current flows from the first ferromagnetic metal layer 6 to the second ferromagnetic metal layer 7, this is set as a positive direction.

An area resistance (RA) is calculated by dividing a resistance value obtained by dividing an applied bias voltage by a current that flows in a lamination direction of the magnetoresistance effect element by an area of a surface to which layers are bonded, and is a normalized resistance value in a unit area. An applied bias voltage and a value of a current that flows in a lamination direction of the magnetoresistance effect element can be obtained by measurement using a voltmeter and an ammeter.

When a high current flows in the magnetoresistance effect element 100, rotation of magnetization occurs due to an STT effect, and a resistance value of the magnetoresistance effect element 100 sharply changes. A value of a current density at which the resistance value sharply changes is called a reverse current density (Jc)[A/$cm^2$]. The reverse current density (Jc) can be obtained when a current is caused to flow in the magnetoresistance effect element 100 while gradually increasing a current value, a resistance of the magnetoresistance effect element 100 is measured, and a current value at which the resistance value sharply changes is measured. Here, in the reverse current density (Jc), a flow of a current from the first ferromagnetic metal layer 6 to the second ferromagnetic metal layer 7 is defined as a positive direction.

(Others)

While an example of a structure in which the first ferromagnetic metal layer 6 having a large coercivity is in a lower position has been described in the present example, the present invention is not limited to such a structure. A structure in which the first ferromagnetic metal layer 6 having a large coercivity is in an upper position has coercivity that is smaller than a structure in which the first ferromagnetic metal layer 6 is in a lower position. However, the tunnel barrier layer 3 can be formed by utilizing crystallinity of the substrate so that it is possible to increase the MR ratio.

In order to utilize the magnetoresistance effect element as a magnetic sensor, a change in resistance with respect to an external magnetic field is preferably linear. In a laminate film of a general ferromagnetic layer, a magnetization direction is easily directed into a lamination surface due to shape anisotropy. In this case, for example, when a magnetic field is applied from the outside and magnetization directions of the first ferromagnetic metal layer and the second ferromagnetic metal layer are perpendicular to each other, a change in resistance with respect to the external magnetic field is linear. However, in this case, since a mechanism for applying a magnetic field to the vicinity of the magnetoresistance effect element is necessary, this is not desirable for integration. When the ferromagnetic metal layer itself has vertical magnetic anisotropy, a method of applying a magnetic field from the outside is unnecessary, and this is beneficial for integration.

The magnetoresistance effect element using the present embodiment can be used as a magnetic sensor or a memory such as an MRAM. In particular, the present embodiment is effective for products that are used with a higher bias voltage than a bias voltage used in the conventional magnetic sensor.

(Production Method)

The magnetoresistance effect element 100 can be formed using, for example, a magnetron sputtering device.

The underlayer 2 can be produced according to a known method, and for example, can be produced by a reactive sputtering method using a mixed gas containing Ar and nitrogen as a sputtering gas.

The tunnel barrier layer 3 can be produced according to a known method. For example, a thin metal film is sputtered onto the first ferromagnetic metal layer 6, natural oxidation occurs due to plasma oxidation or oxygen introduction, and a subsequent heat treatment is performed for formation. As a film formation method, general thin film producing methods such as a vapor deposition method, a laser ablation method, and an MBE method can be used in addition to a magnetron sputtering method.

The first ferromagnetic metal layer 6, the second ferromagnetic metal layer 7, and the cap layer 4 can be produced according to a known method.

The underlayer 2, the first ferromagnetic metal layer 6, the tunnel barrier layer 3, the second ferromagnetic metal layer 7, and the cap layer 4 are formed as films in that order and laminated. The obtained laminate film is preferably subjected to an annealing treatment. A nitride layer (the underlayer 2) made of one or more selected from the group consisting of TiN, VN, NbN, and TaN or, mixed crystals thereof formed by the reactive sputtering method is generally amorphous. The produced magnetoresistance effect element 100 that has undergone the annealing treatment has a higher MR ratio than a produced magnetoresistance effect element 100 without an annealing treatment. The reason for this is inferred to be as follows. The underlayer 2 is partially crystallized due to the annealing treatment, and thus uniformity and orientation of crystal sizes of the tunnel barrier layer of the tunnel barrier layer 3 are improved. As the annealing treatment, preferably, in an inert atmosphere such as Ar, heating is performed at a temperature of 300° C. or more and 500° C. or less for a time of 5 minutes or longer and 100 minutes or shorter, and then, while a magnetic field of 2 kOe or more and 10 kOe or less is applied, heating is performed at a temperature of 100° C. or more and 500° C. or less for a time of 1 hour or longer and 10 hours or shorter.

Second Embodiment

A difference between a second embodiment and the first embodiment is only a method of forming a tunnel barrier layer. In the first embodiment, the tunnel barrier layer is formed by repeatedly performing formation of a metal film, oxidation, formation of a metal film, and oxidation. In the second embodiment, in the oxidation process, a temperature of the substrate is cooled to −70 to −30° C., and then oxidation is performed. When the substrate is cooled, a temperature gradient occurs between the substrate and a vacuum or between the substrate and plasma. First, when oxygen is brought into contact with a surface of the substrate, it reacts with a metal material and oxidation occurs. However, since the temperature is low, oxidation does not proceed. Accordingly, it is easy to adjust an amount of oxygen in the tunnel barrier layer. In addition, when the temperature gradient is formed, it is easy to adjust epitaxial growth (lattice-matched growth). Since crystal growth proceeds according to the temperature gradient, when the temperature of the substrate is sufficiently cooled, epitaxial growth easily occurs. In addition, when the temperature of the substrate increases, a plurality of crystal nuclei are formed inside a surface in which a domain is formed, and crystal nuclei grow independently epitaxially. Therefore, in a portion in which crystal-grown domains are in contact with each other, a portion in which lattices do not match is formed.

Preferably, a part of the tunnel barrier layer has a lattice-matched portion that is lattice-matched with both of the first ferromagnetic metal layer and the second ferromagnetic metal layer. In general, the tunnel barrier layer that is completely lattice-matched with both of the first ferromagnetic metal layer and the second ferromagnetic metal layer is preferable.

However, when complete lattice matching occurs, since electrons that are spin-polarized when they pass through the tunnel barrier layer interfere with each other, hardly any pass through the tunnel barrier layer. On the other hand, when a lattice-matched portion in which lattice matching occurs partially exists, interference of electrons spin-polarized when passing through the tunnel barrier layer is appropriately cut in a portion in which no lattice matching occurs, and the spin-polarized electrons easily pass through the tunnel barrier layer. The volume ratio of the lattice-matched portion in the tunnel barrier layer with respect to the volume of the entire tunnel barrier layer is preferably 70 to 95%. When the volume ratio of the lattice-matched portion in the tunnel barrier layer is less than 70%, since the coherent tunneling effect is weakened, the MR ratio decreases. In addition, when the volume ratio of the lattice-matched portion in the tunnel barrier layer exceeds 95%, an effect of electrons spin-polarized when passing through the tunnel barrier layer interfering with each other is not weakened, and no improvement in effect of spin-polarized electrons passing through the tunnel barrier layer is observed.

(Method of Calculating Volume Ratio of Lattice-Matched Portion)

The volume ratio of the lattice-matched portion (lattice-matched part) with respect to the volume of the entire tunnel barrier layer can be estimated from, for example, a TEM image. In order to determine whether lattice matching occurs, in a cross-sectional TEM image, portions of the tunnel barrier layer, the first ferromagnetic metal layer, and the second ferromagnetic metal layer are subjected to Fourier transform, and an electron beam diffraction image is obtained. In the electron beam diffraction image obtained through Fourier transform, electron beam diffraction places other than in a lamination direction are removed. When this image is subjected to inverse Fourier transform, an image including information about only the lamination direction is obtained. In the lattice line in the inverse Fourier image, a portion in which the tunnel barrier layer is continuously connected to both of the first ferromagnetic metal layer and the second ferromagnetic metal layer is set as a lattice-matched portion. In addition, a portion in which the tunnel barrier layer is not continuously connected to at least one of the first ferromagnetic metal layer and the second ferromagnetic metal layer in the lattice line, or no lattice line is detected is set as a non-lattice-matched portion. Since the lattice-matched portion is continuously connected from the first ferromagnetic metal layer to the second ferromagnetic metal layer through the tunnel barrier layer in the lattice line in the inverse Fourier image, a width ($L_C$) of the lattice-matched portion can be measured from the TEM image. On the other hand, similarly, since the non-lattice-matched portion is not continuously connected in the lattice line in the inverse Fourier image, a width ($L_I$) of the non-lattice-matched portion can be measured from the TEM image. When the width ($L_C$) of the lattice-matched portion is used as a numerator and a sum of the width ($L_C$) of the lattice-matched portion and the width ($L_I$) of the non-lattice-matched portion is used as a denominator, the volume ratio of the lattice-matched portion with respect to the volume of the entire tunnel barrier layer can be obtained. Here, the TEM image is a cross-sectional image, but it includes information containing a depth. Thus, it can be understood that a region estimated from the TEM image is proportional to the volume.

Figure 10:
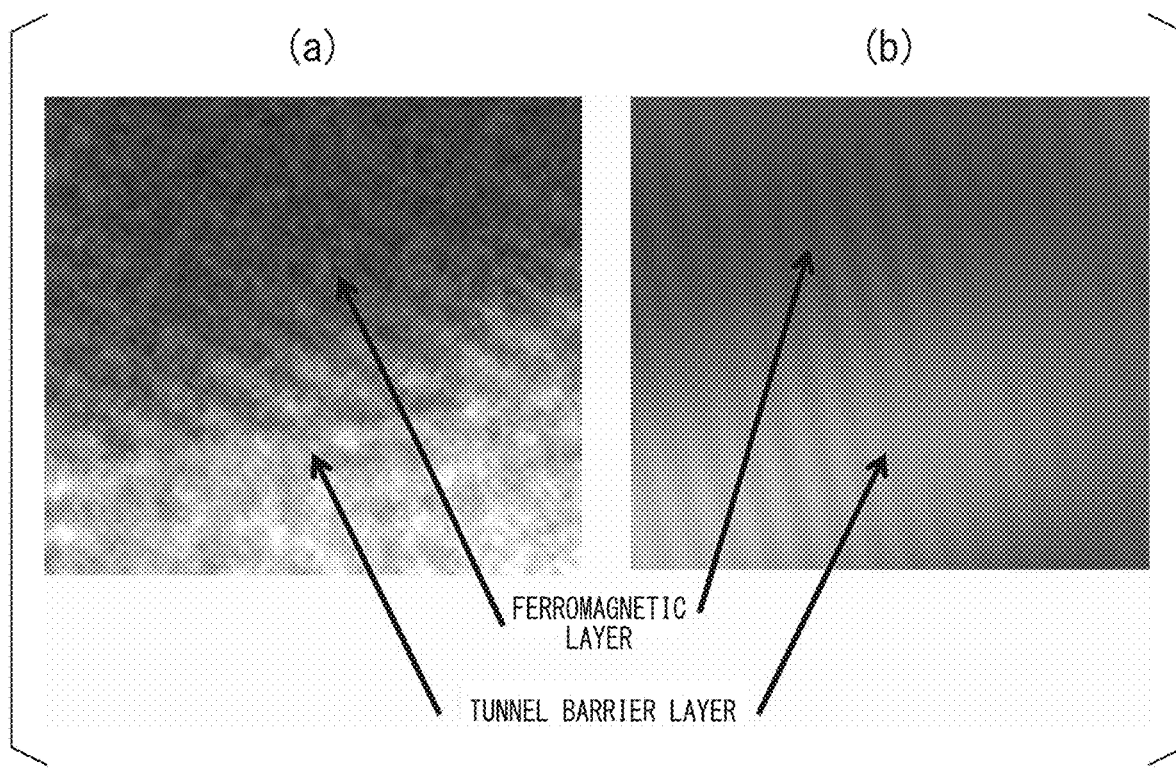
FIG. 10 is an example of a portion in which a tunnel barrier layer and a ferromagnetic metal layer are lattice-matched.

FIG. 10 is an example of a portion in which a tunnel barrier layer and a ferromagnetic metal layer are lattice-matched. FIG. 10(a) is an example of a high resolution cross-sectional TEM image. FIG. 10(b) is an example of an image obtained by removing electron beam diffraction spots other than a lamination direction in an electron beam diffraction image and then performing inverse Fourier transform. In FIG. 10(b), components perpendicular to the lamination direction are removed, and lattice lines can be observed in the lamination direction. It shows that the tunnel barrier layer and the ferromagnetic metal layer are continuously connected without interruption at the interface.

Figure 11:
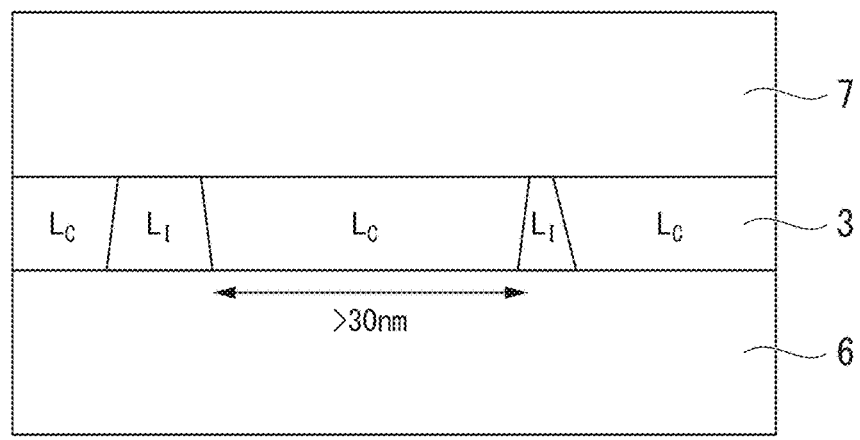
FIG. 11 is a structure diagram of a cross section having a direction parallel to a lamination direction of a tunnel barrier layer.

FIG. 11 is a schematic structure diagram of a cross section having a direction parallel to a lamination direction of the tunnel barrier layer 3.

As shown in FIG. 11, the size (width: $L_C$) of a lattice-matched portion of the tunnel barrier layer 3 in a direction parallel to a film surface is preferably 30 nm or less in any portion. Approximately, 30 nm is about 10 times a lattice constant of a CoFe alloy which is a material of the first ferromagnetic metal layer 6 and the second ferromagnetic metal layer 7. It is thought that mutual interference of spin-polarized electrons in a direction perpendicular to a tunneling direction before and after coherent tunneling is strengthened to about 10 times the lattice constant for purpose.

EXAMPLES

Example 1

An example of a method of producing the magnetoresistance effect element according to the first embodiment will be described below. A film was formed on the substrate 1 on which a thermally oxidized silicon film was provided using a magnetron sputtering method. First, 10 nm of TiN was formed on an upper surface of the substrate 1 as the underlayer 2. The underlayer 2 was formed by a reactive sputtering method in which a Ti target was used as a target and a mixed gas containing Ar and nitrogen (volume ratio 1:1) was used as a sputtering gas. Next, TiN of the underlayer 2 was polished to 4 nm by CMP. Further, 2 nm of FeB was formed on the underlayer 2 as the first ferromagnetic metal layer 6.

Next, the tunnel barrier layer 3 was formed on the first ferromagnetic metal layer 6. A method of forming the tunnel barrier layer 3 will be described. A target having an $MgGa_2$ alloy composition was sputtered to form an $MgGa_2$ film of 0.5 nm. Then, the specimen was moved into an oxidation chamber maintained at an ultra-high vacuum of $1 \times 10^{-8}$ Pa or less, and Ar and oxygen were introduced to cause natural oxidation. A time of natural oxidation was 10 seconds, a partial pressure ratio between Ar and oxygen was 1:25, and a total gas pressure was 0.05 Pa. Then, the film was returned to a film forming chamber, and an $MgGa_2$ film of 0.4 nm was formed. Further, the specimen was moved into an oxidation chamber maintained at an ultra-high vacuum of $1 \times 10^{-8}$ Pa or less, and Ar and oxygen were introduced to cause natural oxidation and inductively coupled plasma oxidation. A time of natural oxidation was 30 seconds, a time of inductively coupled plasma oxidation was 5 seconds, and a partial pressure ratio between Ar and oxygen was 1:20, and a total gas pressure was 0.08 Pa.

The laminate film was moved again to the film forming chamber, and as the second ferromagnetic metal layer 7, FeB(1.0 nm)/Ta(0.2 nm)/[Pt(0.16 nm)/Co(0.16 nm)]$_4$/R (0.9 nm)/[Co(0.24 nm)/Pt(0.16 nm)$_6$] were sequentially formed. Further, as the cap layer 4, Ru (3 nm)/Ta (5 nm) was formed.

The laminate film was provided in an annealing device, treated with Ar at a temperature of 450° C. for 10 minutes, and then was treated at a temperature of 280° C. for 6 hours while applying 8 kOe.

Next, as shown in FIGS. 8 and 9, the magnetoresistance effect device was produced. First, the electrode layer 5 was formed on the cap layer 4. Next, a photoresist was formed using electron beam lithography so that the electrode layer was rotated 90 degrees. A portion other than under the photoresist was scraped off by an ion milling method, the thermally oxidized silicon film serving as the substrate was exposed, and the shape of the underlayer 2 was formed.

Further, in a constricted portion of the shape of the underlayer, a photoresist was formed to have a cylindrical shape of 80 nm using electron beam lithography. A portion other than under the photoresist was scraped off by an ion milling method and the underlayer was exposed. Then, SiOx as an insulating layer was formed in a portion scraped off by ion milling. The cylindrical photoresist of 80 nm was removed here. In order that the photoresist was not formed only in the electrode pad portion of FIGS. 8 and 9, the insulating layer was removed by an ion milling method and the underlayer was exposed. Then, Au was formed. The electrode pad 8 served as a contact electrode with the underlayer of the laminate film. Next, in order to obtain the electrode layer in FIGS. 8 and 9, the shape was formed using the photoresist and an ion milling method, and Au was formed. This served as a contact electrode with the electrode layer of the laminate film.

Physical properties of the obtained magnetoresistance effect element and the composition and the structure of the tunnel barrier layer were evaluated as follows.
(Characteristics Evaluation)

According to the above evaluation method, the MR ratio, $V_{half}$, the area resistance (RA), and the reverse current density (Jc) of the obtained magnetoresistance effect elements were measured. Here, the MR ratio was measured under a condition of a bias voltage of 1 V.
(Composition Analysis of Tunnel Barrier Layer)

Composition analysis of the tunnel barrier layer was performed using energy dispersive X-ray analysis (EDS).

The composition of the tunnel barrier layer was determined by measuring a relative amount of divalent cations (Mg, Zn, Cd) when a content (number of atoms) of Ga was 2. Here, a content of O was measured. However, in general, even when an amount of O in an oxide is outside a quantitative proportion, the crystal structure can be maintained.
(Structural Analysis of Tunnel Barrier Layer)

As structure analysis of the tunnel barrier layer, the crystal structure and the lattice constant were evaluated.

The crystal structure was evaluated using an electron beam diffraction image using a transmission electron beam. When the structure of the barrier layer was examined according to this method, if there is no reflection from the {022} plane that appears in the regular spinel structure, the barrier layer was assumed to have a spinel structure (Sukenel structure) in which cubic cations were disordered.

The lattice constant was evaluated using a 4-axis X-ray diffractometer. When the lattice constant was evaluated, it was difficult to determine the lattice constant with the film thickness of the tunnel barrier layer of the example.

Therefore, in order to obtain the lattice constant of the tunnel barrier layer, a substrate in which a tunnel barrier layer (thickness of 100 nm) was formed on an Si substrate including a thermal oxide film was used. The surface of the Si substrate including a thermal oxide film was amorphous SiOx and the substrate was hardly influenced by formation of the tunnel barrier layer.

In addition, the tunnel barrier layer (thickness of 100 nm) had a film thickness at which an influence of lattice distortion due to the substrate was sufficiently mitigated, and a film thickness at which it was possible to obtain an X-ray intensity for sufficient structural analysis.

Example 2

A magnetoresistance effect element was produced in the same manner as in Example 1 except that 10 nm of VN was formed as the underlayer 2, and physical properties of the obtained magnetoresistance effect element, and the composition and the structure of the tunnel barrier layer were evaluated. The underlayer was formed by a reactive sputtering method in which a V target was used as a target and a mixed gas containing Ar and nitrogen (volume ratio 1:1)

was used as a sputtering gas. Here, VN of the underlayer 2 was polished to 4 nm by CMP.

Example 3

A magnetoresistance effect element was produced in the same manner as in Example 1 except that 10 nm of TaN was formed as the underlayer 2, and physical properties of the obtained magnetoresistance effect element, and the composition and the structure of the tunnel barrier layer were evaluated. The underlayer was formed by a reactive sputtering method in which a Ta target was used as a target and a mixed gas containing Ar and nitrogen (volume ratio 1:1) was used as a sputtering gas. Here, TaN of the underlayer 2 was polished to 4 nm by CMP.

Example 4

A magnetoresistance effect element was produced in the same manner as in Example 1 except that the tunnel barrier layer 3 was formed as follows, and physical properties of the obtained magnetoresistance effect element, and the composition and the structure of the tunnel barrier layer were evaluated.

A target having a $ZnGa_2$ alloy composition was sputtered to form a $ZnGa_2$ film of 0.5 nm.

Then, the specimen was moved into an oxidation chamber maintained at an ultra-high vacuum of $1\times10^{-8}$ Pa or less, and Ar and oxygen were introduced to cause natural oxidation. A time of natural oxidation was 10 seconds, a partial pressure ratio between Ar and oxygen was 1:25, and a total gas pressure was 0.05 Pa. Then, the film was returned to a film forming chamber, and a $ZnGa_2$ film of 0.4 nm was formed. Further, the specimen was moved into an oxidation chamber maintained at an ultra-high vacuum of $1\times10^{-8}$ Pa or less, and Ar and oxygen were introduced to cause natural oxidation and inductively coupled plasma oxidation. A time of natural oxidation was 30 seconds, a time of inductively coupled plasma oxidation was 5 seconds, and a partial pressure ratio between Ar and oxygen was 1:20, and a total gas pressure was 0.08 Pa.

Example 5

A magnetoresistance effect element was produced in the same manner as in Example 1 except that the underlayer 2 and the tunnel barrier layer 3 were formed as follows, and physical properties of the obtained magnetoresistance effect element, and the composition and the structure of the tunnel barrier layer were evaluated.

The underlayer 2 was formed as follows.

10 nm of NbN was formed by a reactive sputtering method in which an Nb target was used as a target, and a mixed gas containing Ar and nitrogen (volume ratio 1:1) was used as a sputtering gas.

Next, NbN of the underlayer 2 was polished to 4 nm by CMP.

The tunnel barrier layer 3 was formed as follows.

A target having a $CdGa_2$ alloy composition was sputtered to form a $CdGa_2$ film of 0.5 nm.

Then, the specimen was moved into an oxidation chamber maintained at an ultra-high vacuum of $1\times10^{-8}$ Pa or less, and Ar and oxygen were introduced to cause natural oxidation. A time of natural oxidation was 10 seconds, a partial pressure ratio between Ar and oxygen was 1:25, and a total gas pressure was 0.05 Pa. Then, the film was returned to a film forming chamber, and a $CdGa_2$ film of 0.4 nm was formed. Further, the specimen was moved into an oxidation chamber maintained at an ultra-high vacuum of $1\times10^{-8}$ Pa or less, and Ar and oxygen were introduced to cause natural oxidation and inductively coupled plasma oxidation. A time of natural oxidation was 30 seconds, a time of inductively coupled plasma oxidation was 5 seconds, and a partial pressure ratio between Ar and oxygen was 1:20, and a total gas pressure was 0.08 Pa. Here, it was confirmed that all of the tunnel barrier layer, the first ferromagnetic metal layer, and the second ferromagnetic metal layer had directions of basic lattices that matched and had a cubic-on-cubic structure.

Example 6

A magnetoresistance effect element was produced in the same manner as in Example 1 except that the tunnel barrier layer 3 was formed as follows, and physical properties of the obtained magnetoresistance effect element, and the composition and the structure of the tunnel barrier layer were evaluated.

A target having an Mg and $Mg_{0.5}Ga_2$ alloy composition was sputtered to form an Mg (0.05 nm)/$Mg_{0.5}Ga_2$ (0.4 nm) film. Then, the specimen was moved into an oxidation chamber maintained at an ultra-high vacuum of $1\times10^{-8}$ Pa or less, and Ar and oxygen were introduced to cause natural oxidation. A time of natural oxidation was 10 seconds, a partial pressure ratio between Ar and oxygen was 1:25, and a total gas pressure was 0.05 Pa. Then, the film was returned to a film forming chamber, and an Mg (0.05 nm)/$Mg_{0.5}Ga_2$ (0.4 nm) film was formed. Further, the specimen was moved into an oxidation chamber maintained at an ultra-high vacuum of $1\times10^{-8}$ Pa or less, and Ar and oxygen were introduced to cause natural oxidation and inductively coupled plasma oxidation. A time of natural oxidation was 30 seconds, a time of inductively coupled plasma oxidation was 5 seconds, and a partial pressure ratio between Ar and oxygen was 1:20, and a total gas pressure was 0.08 Pa.

Comparative Example 1

A magnetoresistance effect element was produced in the same manner as in Example 1 except that 10 nm of Cu was formed as the underlayer 2, and physical properties of the obtained magnetoresistance effect element, and the composition and the structure of the tunnel barrier layer were evaluated. The underlayer was formed by a sputtering method in which a Cu target was used as a target. Here, 20 nm of Cu was formed and then 10 nm of Cu was formed by CMP.

Comparative Example 2

A magnetoresistance effect element was produced in the same manner as in Example 1 except that 4 nm of ZrN was formed as the underlayer 2, and physical properties of the obtained magnetoresistance effect element, and the composition and the structure of the tunnel barrier layer were evaluated. The underlayer was formed by a reactive sputtering method in which a Zr target was used as a target, and a mixed gas containing Ar and nitrogen (volume ratio 1:1) was used as a sputtering gas.

Comparative Example 3

A magnetoresistance effect element was produced in the same manner as in Example 4 except that 4 nm of ZrN was formed as the underlayer 2, and physical properties of the obtained magnetoresistance effect element, and the composition and the structure of the tunnel barrier layer were evaluated. The underlayer was formed by a reactive sput- Here, all of the tunnel barrier layers 3 of the magnetoresistance effect elements produced in Examples 1 to 6 and Comparative Examples 2 to 4 had a disordered spinel structure (Sukenel structure).

TABLE 1

| | Underlayer | | First ferromagnetic metal layer | Tunnel barrier layer | | Second ferromagnetic metal layer | Cap layer | lattice mismatching degree [%] | MR ratio @ 1 V [%] | $V_{half}$ [V] | RA [Ω μm²] | Jc [A/cm²] |
|---|---|---|---|---|---|---|---|---|---|---|---|---|
| | Composition | Lattice constant (nm) | | Composition | Lattice constant (nm) | | | | | | | |
| Example 1 | TiN | 0.4241 | FeB | $MgGa_2O_y$ | 0.4142 | $FeB/Ta/[Pt/Co]_4/Ru/[Co/Pt]_6$ | Ru/Ta | 2.3 | 72.3 | +1, −1 | 0.58 | $6.9 \times 10^8$ |
| Example 2 | VN | 0.4135 | FeB | $MgGa_2O_y$ | 0.4142 | $FeB/Ta/[Pt/Co]_4/Ru/[Co/Pt]_6$ | Ru/Ta | 0.2 | 80.1 | +0.95, −0.95 | 0.55 | $4.7 \times 10^8$ |
| Example 3 | TaN | 0.4330 | FeB | $MgGa_2O_y$ | 0.4142 | $FeB/Ta/[Pt/Co]_4/Ru/[Co/Pt]_6$ | Ru/Ta | 4.3 | 68 | +1, −1 | 0.60 | $8.7 \times 10^8$ |
| Example 4 | TiN | 0.4241 | FeB | $ZnGa_2O_y$ | 0.4168 | $FeB/Ta/[Pt/Co]_4/Ru/[Co/Pt]_6$ | Ru/Ta | 1.7 | 58.1 | +1, −0.95 | 0.61 | $1.0 \times 10^9$ |
| Example 5 | NbN | 0.4391 | FeB | $CdGa_2O_y$ | 0.4308 | $FeB/Ta/[Pt/Co]_4/Ru/[Co/Pt]_6$ | Ru/Ta | 1.9 | 55 | +1, −1 | 0.63 | $5.1 \times 10^8$ |
| Example 6 | TiN | 0.4241 | FeB | $Mg_{0.81}Ga_2O_y$ | 0.4097 | $FeB/Ta/[Pt/Co]_4/Ru/[Co/Pt]_6$ | Ru/Ta | 3.4 | 75 | +0.9, −0.9 | 0.57 | $5.6 \times 10^8$ |
| Comparative Example 1 | Cu | 0.3615 | FeB | $MgGa_2O_y$ | 0.4142 | $FeB/Ta/[Pt/Co]_4/Ru/[Co/Pt]_6$ | Ru/Ta | 14.6 | 61.4 | 0.8, −0.65 | 0.62 | $2.0 \times 10^9$ |
| Comparative Example 2 | ZrN | 0.4573 | FeB | $MgGa_2O_y$ | 0.4142 | $FeB/Ta/[Pt/Co]_4/Ru/[Co/Pt]_6$ | Ru/Ta | 9.4 | 60.8 | 0.8, −0.65 | 0.63 | $1.9 \times 10^9$ |
| Comparative Example 3 | ZrN | 0.4573 | FeB | $ZnGa_2O_y$ | 0.4168 | $FeB/Ta/[Pt/Co]_4/Ru/[Co/Pt]_6$ | Ru/Ta | 8.9 | 49.2 | 0.9, −0.9 | 0.68 | $1.8 \times 10^9$ |
| Comparative Example 4 | ZrN | 0.4573 | FeB | $CdGa_2O_y$ | 0.4308 | $FeB/Ta/[Pt/Co]_4/Ru/[Co/Pt]_6$ | Ru/Ta | 5.8 | 48.8 | 0.85, −0.85 | 0.65 | $1.8 \times 10^9$ | tering method in which a Zr target was used as a target, and a mixed gas containing Ar and nitrogen (volume ratio 1:1) was used as a sputtering gas.

Comparative Example 4

A magnetoresistance effect element was produced in the same manner as in Example 5 except that 4 nm of ZrN was formed as the underlayer 2, and physical properties of the obtained magnetoresistance effect element, and the composition and the structure of the tunnel barrier layer were evaluated. The underlayer was formed by a reactive sputtering method in which a Zr target was used as a target, and a mixed gas containing Ar and nitrogen (volume ratio 1:1) was used as a sputtering gas.

Comparison of Examples with Comparative Examples

Table 1 shows compositions of layers of the magnetoresistance effect elements produced in Examples 1 to 6 and Comparative Examples 1 to 4, the lattice constant of the nitride constituting the underlayer 2, the lattice constant of the compound constituting the tunnel barrier layer 3, the lattice mismatching degree of the underlayer 2 and the tunnel barrier layer 3, the MR ratio, $V_{half}$, RA, and Jc. Here, the lattice constant of the nitride is a value at which the crystal structure is a tetragonal structure (NaCl structure) and a space group is Fm-3m. The lattice mismatching degree is a value calculated when n in the above computation formula is set to 1. In addition, in $V_{half}$ and Jc, a +(positive) value is that at which a current flows from the first ferromagnetic metal layer 6 to the second ferromagnetic metal layer 7. A −(negative) value is that at which a current flows from the second ferromagnetic metal layer 7 to the first ferromagnetic metal layer 6.

When comparing Examples 1 to 3 with Comparative Examples 1 and 2, comparing Example 4 with Comparative Example 3, and comparing Example 5 with Comparative Example 4, it was found that the magnetoresistance effect elements produced in the examples had a high MR ratio and low RA and Jc. In addition, it was found that, in all of the magnetoresistance effect elements produced in the examples, $V_{half}$ had almost the same + and − values, and the symmetry of the MR ratio with respect to the polarity of a bias voltage was favorable. This is thought to be caused by the fact that the magnetoresistance effect elements of Comparative Examples 1 to 4 had a lower lattice mismatching degree between the crystal lattice constant of the material constituting the tunnel barrier layer and the crystal lattice constant that a nitride constituting the underlayer has than the magnetoresistance effect elements of Examples 1 to 6.

In addition, it was found that the magnetoresistance effect element of Example 6 in which the tunnel barrier layer had a disordered spinel structure ($Mg_{0.81}Ga_2O_y$) had a higher MR ratio and a lower RA and Jc than the magnetoresistance effect element of Example 1 having a regular spinel structure ($MgGa_2O_y$).

Based on the results of the above examples, according to the present invention, it was confirmed that it was possible to obtain a magnetoresistance effect element which has favorable symmetry of an MR ratio with respect to the polarity of a bias voltage and is capable of efficiently reversing magnetization according to a current, and has a high MR ratio.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

EXPLANATION OF REFERENCES

100: Magnetoresistance effect element
200: Magnetoresistance effect device
1: Substrate
2: Underlayer
3: Tunnel barrier layer
4: Cap layer
5: Electrode layer
6: First ferromagnetic metal layer
7: Second ferromagnetic metal layer
8: Electrode pad
71: Current source
72: Voltmeter

What is claimed is:

1. A magnetoresistance effect element comprising a laminate in which:
an underlayer;
a first ferromagnetic metal layer;
a tunnel barrier layer, and
a second ferromagnetic metal layer are laminated in this order,
wherein the underlayer is made of one or more selected from a group consisting of TiN, VN, NbN, and TaN, and
the tunnel barrier layer is made of a compound having a spinel structure and represented by a composition formula (1) below, $$A_xGa_2O_y \quad (1):$$

where A is a non-magnetic divalent cation and represents a cation of at least one element selected from a group consisting of magnesium, zinc, and cadmium,
x is a number that satisfies $0<x\leq 2$, and
y is a number that satisfies $0<y\leq 4$, wherein
the tunnel barrier layer has a spinel structure in which an atomic arrangement is disordered.

2. The magnetoresistance effect element according to claim 1,
wherein A in the composition formula (1) is a cation of at least one element selected from a group consisting of magnesium and zinc, and
the underlayer is made of mixed crystals of one or more selected from a group consisting of TiN, VN, and TaN.

3. The magnetoresistance effect element according to claim 1,
wherein A in the composition formula (1) is a cadmium ion, and
the underlayer is made of NbN.

4. The magnetoresistance effect element according to claim 3,
wherein the tunnel barrier layer comprises: a lattice-matched portion that lattice-matches with both of the first ferromagnetic metal layer and the second ferromagnetic metal layer; and a non-lattice-matched portion that is free of a lattice-matching with at least one of the first ferromagnetic metal layer and the second ferromagnetic metal layer.

5. The magnetoresistance effect element according to claim 1,
wherein the tunnel barrier layer has a spinel structure in which an atomic arrangement is disordered.

6. The magnetoresistance effect element according to claim 1,
wherein a crystal lattice of either or both of the first ferromagnetic metal layer and the second ferromagnetic metal layer matches the tunnel barrier layer in a cubic-on-cubic structure.

7. The magnetoresistance effect element according to claim 2,
wherein a crystal lattice of either or both of the first ferromagnetic metal layer and the second ferromagnetic metal layer matches the tunnel barrier layer in a cubic-on-cubic structure.

8. The magnetoresistance effect element according to claim 3,
wherein a crystal lattice of either or both of the first ferromagnetic metal layer and the second ferromagnetic metal layer matches the tunnel barrier layer in a cubic-on-cubic structure.

9. The magnetoresistance effect element according to claim 4,
wherein a crystal lattice of either or both of the first ferromagnetic metal layer and the second ferromagnetic metal layer matches the tunnel barrier layer in a cubic-on-cubic structure.

10. The magnetoresistance effect element according to claim 5,
wherein a crystal lattice of either or both of the first ferromagnetic metal layer and the second ferromagnetic metal layer matches the tunnel barrier layer in a cubic-on-cubic structure.

11. The magnetoresistance effect element according to claim 1,
wherein at least one of the first ferromagnetic metal layer and the second ferromagnetic metal layer has magnetic anisotropy perpendicular to a lamination direction.

12. The magnetoresistance effect element according to claim 2,
wherein at least one of the first ferromagnetic metal layer and the second ferromagnetic metal layer has magnetic anisotropy perpendicular to a lamination direction.

13. The magnetoresistance effect element according to claim 3,
wherein at least one of the first ferromagnetic metal layer and the second ferromagnetic metal layer has magnetic anisotropy perpendicular to a lamination direction.

14. The magnetoresistance effect element according to claim 4,
wherein at least one of the first ferromagnetic metal layer and the second ferromagnetic metal layer has magnetic anisotropy perpendicular to a lamination direction.

15. The magnetoresistance effect element according to claim 5,
wherein at least one of the first ferromagnetic metal layer and the second ferromagnetic metal layer has magnetic anisotropy perpendicular to a lamination direction.

16. The magnetoresistance effect element according to claim 1,
wherein at least one of the first ferromagnetic metal layer and the second ferromagnetic metal layer is $Co_2Mn_{1-a}Fe_aAl_bSi_{1-b}$ ($0\leq a\leq 1$, $0\leq b\leq 1$).

17. The magnetoresistance effect element according to claim 2,
wherein at least one of the first ferromagnetic metal layer and the second ferromagnetic metal layer is $Co_2Mn_{1-a}Fe_aAl_bSi_{1-b}$ ($0\leq a\leq 1$, $0\leq b\leq 1$).

18. The magnetoresistance effect element according to claim 3, wherein at least one of the first ferromagnetic metal layer and the second ferromagnetic metal layer is $Co_2Mn_{1-a}Fe_aAl_bSi_{1-b}$ ($0 \leq a \leq 1$, $0 \leq b \leq 1$).

19. The magnetoresistance effect element according to claim 4, wherein at least one of the first ferromagnetic metal layer and the second ferromagnetic metal layer is $Co_2Mn_{1-a}Fe_aAl_bSi_{1-b}$ ($0 \leq a \leq 1$, $0 \leq b \leq 1$).

20. The magnetoresistance effect element according to claim 5, wherein at least one of the first ferromagnetic metal layer and the second ferromagnetic metal layer is $Co_2Mn_{1-a}Fe_aAl_bSi_{1-b}$ ($0 \leq a \leq 1$, $0 \leq b \leq 1$).

* * * * *